US006947491B2

(12) United States Patent
Shahrier

(10) Patent No.: US 6,947,491 B2
(45) Date of Patent: Sep. 20, 2005

(54) THIRD GENERATION FDD MODEM INTERLEAVER

(75) Inventor: Sharif M. Shahrier, King of Prussia, PA (US)

(73) Assignee: InterDigital Technology Corporation, Wilmington, DE (US)

( * ) Notice: Subject to any disclaimer, the term of this patent is extended or adjusted under 35 U.S.C. 154(b) by 775 days.

(21) Appl. No.: 09/908,820

(22) Filed: Jul. 19, 2001

(65) Prior Publication Data

US 2002/0083279 A1 Jun. 27, 2002

Related U.S. Application Data

(60) Provisional application No. 60/260,930, filed on Jan. 11, 2001, and provisional application No. 60/232,224, filed on Sep. 13, 2000.

(51) Int. Cl.$^7$ ............................................. H04L 5/12
(52) U.S. Cl. ............................................. 375/262
(58) Field of Search ........................... 375/261–262, 375/265, 341, 285, 340; 714/701–702, 755–756, 768, 792, 794–795, 776, 779, 790; 370/319, 344, 476; 711/157

(56) References Cited

U.S. PATENT DOCUMENTS

| 4,394,642 | A | * | 7/1983 | Currie et al. ................. 341/81 |
| 5,912,898 | A | * | 6/1999 | Khoury ....................... 714/701 |
| 6,411,654 | B1 | * | 6/2002 | Furutani et al. ............ 375/262 |
| 6,493,815 | B1 | * | 12/2002 | Kim et al. ................... 711/217 |
| 6,553,517 | B1 | * | 4/2003 | Prasad ......................... 714/702 |

OTHER PUBLICATIONS

3GPP: "3G TS 25.212 Version 3.0.0" 3rd Generation Partnership Project (3GPP), Oct. 1999, pp. 1–54, XP002149187.

* cited by examiner

Primary Examiner—Tesfaldet Bocure
Assistant Examiner—Khanh Tran
(74) Attorney, Agent, or Firm—Volpe and Koenig, P.C.

(57) ABSTRACT

A method and apparatus are disclosed for deinterleaving expanded interleaved data blocks, particularly for use in a wireless telecommunications system such as provided by the Third Generation Partnership Project (3G) standard. The data is processed on a sequential element basis where each element has a pre-determined number of bits M which bits are contained in a block of sequential data words W'. The elements are extracted from the block of words W' in sequential order, each element being extracted from either a single or two sequential interleaved words within the set of words W'. The elements are stored in selective location within a set of words W of a deinterleaver memory such that upon completion of the extraction and writing of all the elements, the words W from the deinterleaver memory can be sequentially read out to correspond to an original data block of bits from which the block of interleaved elements was created. Additional conventional processing results in the contraction of the deinterleaved expanded words to reproduce the data block of bits in a receiver as originally designated for transmission in a transmitter.

24 Claims, 16 Drawing Sheets

|  | Column 0 |  |  |  |  |  | Column 1 |  |  |  |  |  | Column 2 ... |  |
|---|---|---|---|---|---|---|---|---|---|---|---|---|---|---|
| | W'0,0 | W'0,1 | W'0,2 | W'0,3 | W'0,4 | W'0,5 | W'23,8 | W'23,9 | W'23,10 | W'23,11 | W'23,12 | W'23,13 | W'48,18 | W'48,19 |
| | W'0,6 | W'0,7 | W'0,8 | W'0,9 | W'0,10 | W'0,11 | W'23,14 | | | | | W'23,19 | W'48,24 | |
| | W'0,12 | | | | | W'0,17 | W'23,20 | | | | | W'23,25 | W'48,30 | |
| | W'0,18 | | | | | W'0,23 | W'23,26 | | | | | W'23,31 | W'49,4 | |
| | W'0,24 | | | | | W'0,29 | W'24,0 | | | | | W'24,5 | W'49,10 | |
| | W'0,30 | W'0,31 | W'1,0 | W'1,1 | W'1,2 | W'1,3 | W'24,6 | | | | | W'24,11 | W'49,16 | |
| | W'1,4 | | | | | W'1,9 | W'24,12 | | | | | W'24,17 | W'49,22 | |
| | W'1,10 | | | | | W'1,15 | W'24,18 | | | | | W'24,23 | W'49,28 | |
| | W'1,16 | | | | | W'1,21 | W'24,24 | | | | | W'24,29 | W'50,2 | |
| | W'1,22 | | | | | | W'24,30 | W'24,31 | W'25,0 | W'25,1 | W'25,2 | W'25,3 | W'50,8 | W'50,9 |
| | W'1,28 | W'1,29 | W'1,30 | W'1,31 | W'2,0 | W'2,1 | W'25,4 | | | | | W'25,9 | W'50,14 | W'50,15 |

| Column 27 | | | Column 28 | | | Column 29 | | | |
|---|---|---|---|---|---|---|---|---|---|
| W"54,10 | | | W"21,12 | | | W"21,17 | W"44,26 | W"44,27 | W"44,28 | W"44,29 | W"44,30 | W"44,31 |

(Table content too complex to fully reconstruct reliably)

FIG. 6

(Timing diagram showing W0 with labels T0, T1, T2, T3, T4, T5... and T124, T258, T62, T186, T31... with W' and W entries)

FIG. 7a

| ...Column 27 | | Column 28 | | | Column 29 | | |
|---|---|---|---|---|---|---|---|
| W5,6 | W5,8 | | W5,13 | W5,14 | | | W5,19 |
| ...T27 | | T28 | | | T29 | | |
| W10,26 | W10,28 | W10,31 | W11,0 | W11,1 | W11,2 | | W11,7 |
| ...T57 | | T58 | | | T59 | | |
| W16,4 | W15,6 | | | | W16,12 | | W16,29 |
| ...T87 | | T88 | | | T89 | | |
| W22,2 | W22,4 | | | | W22,10 | | W22,15 |
| ...T117 | | T118 | | | T119 | | |
| W27,22 | W27,24 | | | | W27,30 | W27,31 W28,0 | W28,3 |
| ...T147 | | T148 | | | T149 | | |
| W33,10 | W33,12 | | | | W33,18 | | W33,23 |
| ...T177 | | T178 | | | T179 | | |
| W38,30 W38,31 | W39,0 | | | | W39,6 | | W39,11 |
| ...T207 | | T208 | | | T209 | | |
| W44,18 | W44,20 | | | | W44,26 | | W44,31 |
| ...T237 | | T238 | | | T239 | | |
| W50,6 | W50,8 | | | | W50,14 | | W50,19 |
| ...T267 | | T268 | | | T269 | | |
| W55,26 | W55,28 | W55,31 W56,0 | W56,1 | W56,2 | | | W56,7 |
| ...T297 | | T298 | | | T299 | | |
| x | x | x | x | x | x | x | x |

THIRD GENERATION FDD MODEM INTERLEAVER

CROSS REFERENCE TO RELATED APPLICATIONS

This application claims priority from U.S. Provisional Application No. 60/232,224, filed on Sep. 13, 2000 and U.S. Provisional Application No. 60/260,930, filed on Jan. 11, 2001.

The present application relates to interleaving of data in a telecommunications system. In particular, method and apparatus for de-interleaving data.

BACKGROUND

It is known in the wireless telecommunications art to scramble data through a process known as interleaving for transmitting the data from one communication station to another communication station. The data is then de-scrambled through a de-interleaving process at the receiving station.

In Third Generation Partnership Project (3G) wireless systems, a specific type of data interleaving for frequency division duplex (FDD) modems physical channel data is specified. Physical channel data in a 3G system is processed in words having a pre-defined bit size, which is currently specified as 32 bits per word.

Blocks of arbitrary numbers of sequential data bits contained within sequential data words are designated for communication over FDD physical channels. In preparing each data block for transmission over the channel, the data is mapped row by row to a matrix having a pre-determined number of columns. Preferably there are fewer columns than the number of bits in a word. Currently 30 columns are specified in 3G for physical channel interleaving of data bit blocks contained in 32 bit words.

For example, a mapping of a 310 data bit block contained as bits $w_{0,0}$–$w_{9,21}$ within ten 32-bit words w0–w9 to a thirty column matrix is illustrated in FIG. 1. The 310 data bit block is mapped to a 30 column matrix having 11 rows. Since the data block has a total of 310 bits, the last twenty of the columns, columns 10–29, include one fewer data bit then the first ten columns, 0–9.

Whether or not all of the matrix columns have bits of data mapped to them is dependent upon the number of bits in the block of data. For example, a block of 300 data bits would be mapped to a 30×10 matrix completely filling all the columns since 300 is evenly divisible by 30. In general, for mapping a block of T elements, the last r columns of a C column by N row matrix will only have data in N−1 rows where r=(C*N)−T and r<C.

After the data bits have been mapped to the interleaver matrix, the order of the columns is rearranged in a pre-defined sequence and the data bits are written to a new set of words w' on a column by column sequential basis to define an interleaved data block of sequential bits $w'_{\#,\#}$ in a set of sequential words w'.

For example, the 310 bit block of data contained in words w0–w9 of FIG. 1 is selectively stored to words w'0–w'9, in accordance with the preferred interleaver column sequence as shown in FIGS. 2a, 2b. For the set of words, w0–w9, the corresponding interleaved block of ten words w'0–w'9 contain all of the 310 bits of data of the original words w0–w9 in a highly rearranged/scrambled order. As shown in FIG. 2a, interleaved word w'0 is formed of a sequence of bits from columns 0, 20 and 10 of FIG. 1. The correspondence of the bits $w_{\#,\#}$ from the original words w0–w9 to the bits $w'_{0,0}$–$w'_{0,31}$ of interleaved word w'0 is illustrated in FIG. 2b.

Various processes may occur concerning the interleaved data before it is transmitted to a receiving station. For example, the bit size structure may be expanded M number of times. If the bit expansion is specified as six fold, each of the interleaved data bits for a block of physical channel data is expanded to a six bit element. Also, other processes can occur concerning the interleaved data between the transmitter and the receiving station's deinterleaver that make it appear to the receiver's deinterleaver that bit expansion has occurred even though no such bit expansion was performed in transmission processing. For example, a receiving station may sample a received signal using an A/D converter and descramble/dispread clip samples into symbols with the resulting value having a multi-bit representation. Each original interleaved bit from the transmitter then appears to have been expanded M number of times.

By way of example, the ten interleaved data words w'0–w'9 of the example of FIGS. 2a and 2b are expanded into a block of 59 words W'0–W'58 for transmission and/or during reception processing as reflected in FIG. 3. FIGS. 4a–4f illustrate an example of the correspondence of the interleaved bits w'0,0–w'0,31 of word w'0 to expanded interleaved six-bit elements T'0–T'31 of words W'0–W'5.

Since the element bit size does not evenly divide into the word bit size, some elements span two sequential words. For example, in FIGS. 4a and 4b, element T'5 is partially contained in word W'0 and partly contained in the next word W'1.

In the receiving station, after reception and processing, the received block of expanded interleaved elements, for example, the bit $W'_{0,0}$–$W'_{58,3}$ in the 59 words W'0–W'58, must be deinterleaved, i.e. descrambled, to reassemble the data in its original sequential form. It would be highly advantageous to provide a method and apparatus for deinterleaving of expanded column interleaved data blocks in a fast and efficient manner.

SUMMARY

A method and apparatus are disclosed for deinterleaving expanded interleaved data blocks, particularly for use in a wireless telecommunications system such as provided by the Third Generation Partnership Project (3G) standard. The data is processed on a sequential element basis where each element has a pre-determined number of bits M which bits are contained in a block of sequential data words W'. The elements are extracted from the block of words W' in sequential order, each element being extracted from either a single or two sequential interleaved words within the set of words W'. The elements are stored in selective location within a set of words W of a deinterleaver memory such that upon completion of the extraction and writing of all the elements, the set of words W from the deinterleaver memory can be sequentially read out to correspond to an original data block of bits from which the block of interleaved elements was created. Additional conventional processing results in the contraction of the deinterleaved expanded words to reproduce the data block of bits in a receiver as originally designated for transmission in a transmitter.

Although the method and apparatus were specifically designed for a $2^{nd}$ de-interleaving function of a 3G FDD receiver modem, the invention is readily adaptable for either scrambling and descrambling expanded data blocks for other applications.

Preferably, a multi-stage pipeline configuration is employed to process the elements in conjunction with calculating a deinterleaver memory address and selective storage of the data elements therein. Data throughput of up to 60 megabits per second has been realized using a preferred three stage pipeline. Also, multiple deinterleavers may be used parallel to process multiple blocks of data, each, for example, for a group of different physical channels, so that the deinterleaving process does not adversely impact on the overall speed of the communications system. However, since the physical channel processing of each channel is currently specified as 380 kilobits per second, the speed of a single deinterleaver in accordance with the preferred construction is more than adequate to process the data element blocks of all of physical channels of a 3G FDD receiver modem.

Other objects and advantages of the present invention will be apparent to those of ordinary skill in the art from the drawings the following detailed description.

BRIEF DESCRIPTION OF THE DRAWINGS

FIG. 1 illustrates a mapping of a block of 310 data bits contained in ten 32-bit words w upon a thirty column matrix.

Figures 2A, 3:
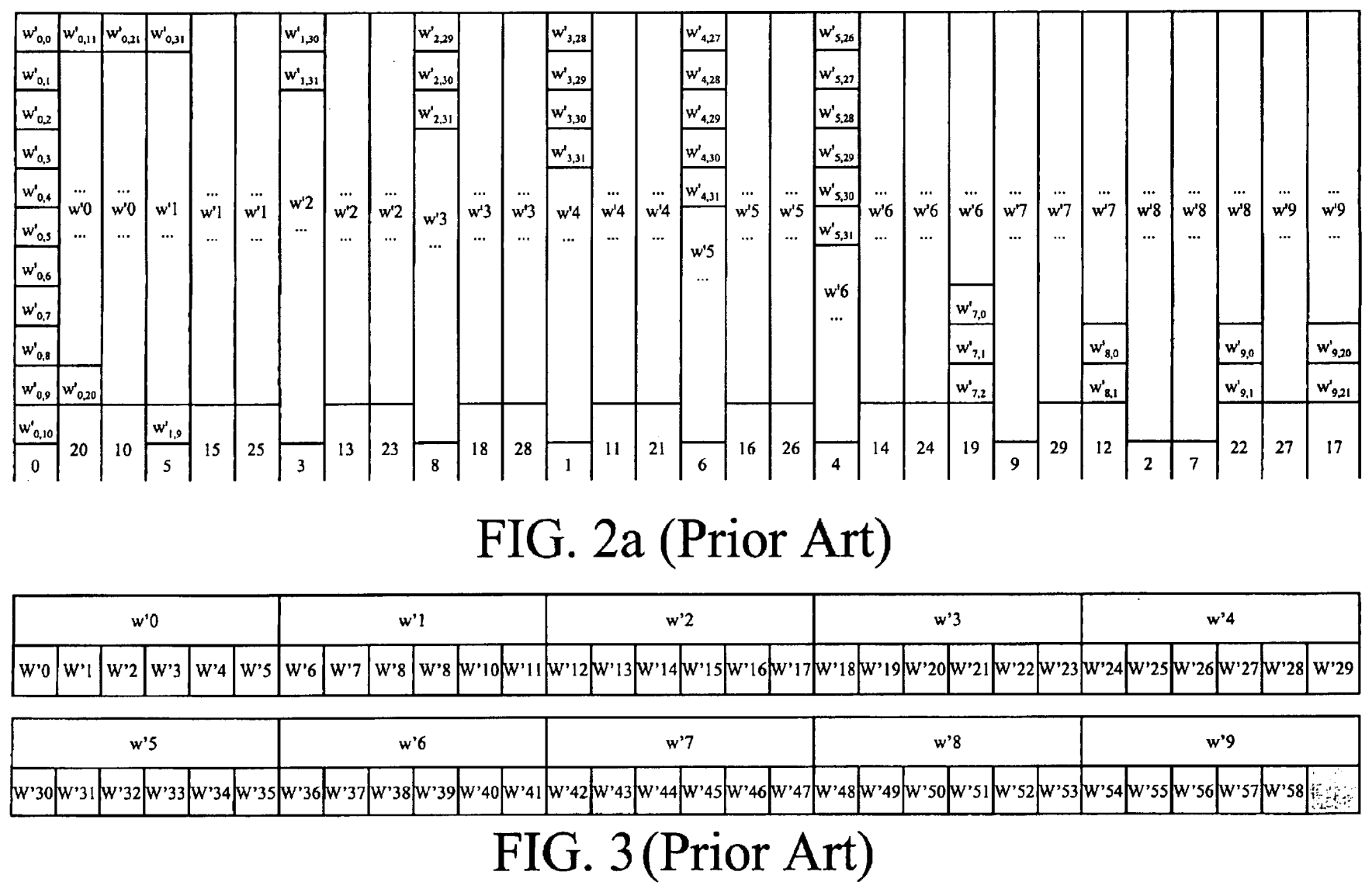

FIG. 2a illustrates a mapping of the data bit block of FIG. 1 onto a block of interleaved bits $w_{\#,\#}$ of words w' in accordance with a current 3G interleaver column sequence specification.

FIG. 2b illustrates a bit mapping for one interleaved word w' from bits of data words w of FIG. 1.

FIG. 3 illustrates an expansion mapping of the interleaved bit block words w' of FIG. 2a onto an expanded set of interleaved six-bit element words W'

FIGS. 5a and 5b illustrate a mapping of the bits of the block of expanded interleaved elements of words W' of FIG. 3 onto an interleaver matrix of thirty six-bit element columns.

FIG. 6 illustrates bit and element mapping for one word W of the deinterleaved element block of data on the matrix of FIGS. 5a and 5b.

FIGS. 7a through 7c illustrate a corresponding deinterleaved expanded element and bit mapping of the matrix of FIGS. 5a and 5b and ordering of the set of expanded element words W.

DETAILED DESCRIPTION OF THE PREFERRED EMBODIMENTS

Figure 9:
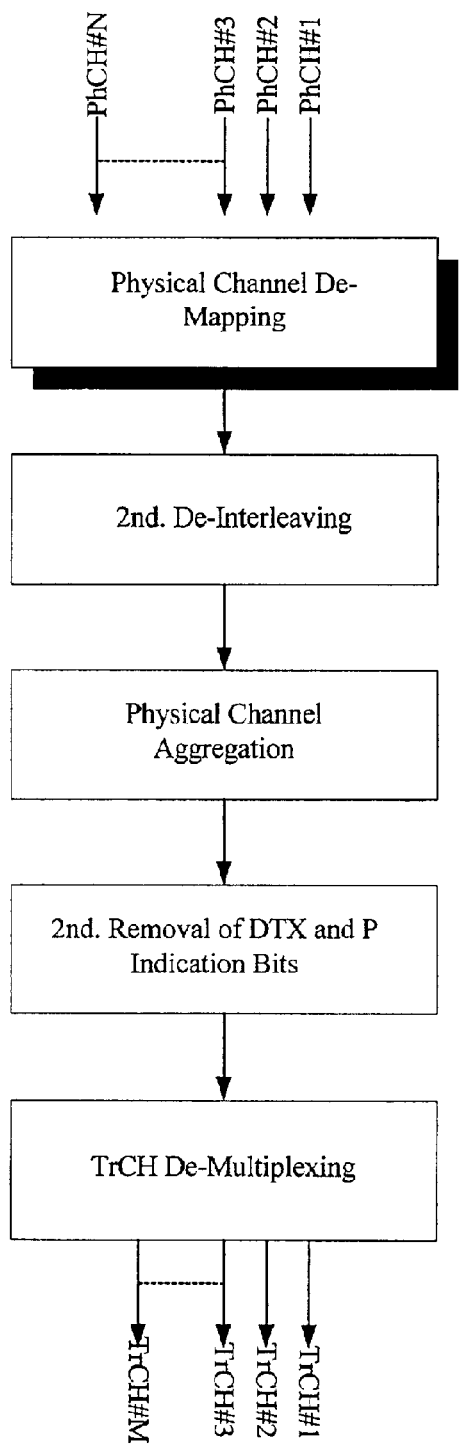
FIG. 9 is a block diagram of receiver processing components of a communication system which utilizes the current invention.

As part of the current 3G specification, blocks of expanded interleaved data, for example, data for physical channels of an FDD receiver are received and must be deinterleaved for further processing. The FDD receiver is divided up into a number of sub-blocks. One of these blocks is called the Receiver Composite Channel (RCC). The RCC block diagram is shown in FIG. 9. It consists of physical channel de-mapping, $2^{nd}$ de-interleaving, physical channel aggregation, $2^{nd}$ stripping of DTX and P indication bits and Transmit Channel (TrCH) demultiplexing. Effectively, the receiver composite channel operations are opposite to functions performed by a transmitter modem in a transmitter composite channel.

The present invention is particularly useful for the architecture of the $2^{nd}$ de-interleaver of an FDD receiver. The bit sequence to be transmitted for each physical channel (PyCH) is scrambled through an interleaver process. In processing, each element of the scrambled bit sequence is typically expanded into equal sized packets; each packet consisting of a small number M of bits. Each of these groups of bits is referred to herein a data element. In one currently employed receiver for a 3G FDD system, 3G FDD physical channel data element size of received interleaved elements is specified as six bits, i.e. M=6 in the preferred embodiment. FIGS. 1–4 illustrate an example of the transmitter modem interleaving and the subsequent expansion of a 310 data bit block into a block of 310 interleaved six-bit elements T.

The receiver receives the interleaved data elements over the air, and is faced with the task of deinterleaving data elements which are represented by an expanded it set, such as the preferred six bit sets illustrated in the example. The receiver stores the interleaved elements in a set of sequential 32-bit data words W'. In the example of FIGS. 1–4, the data block of 310 bits initially stored in 32-bit words w0–w9 on the transmitter side is received and stored as data elements T'0–T'309 in 32-bit words W'0–W'58 on the receiver side.

The $2^{nd}$ interleaver is a block interleaver with inter-column permutations which resequences the interleaved data elements. The interleaving matrix has 30 element columns, numbered 0, 1, 2, . . . , 29 from left to right. The number of rows is provided by the user as an external parameter N, but can be calculated for a data block having T elements as the least integer N such that N*30≧T.

The inter-column permutation pattern for the $2^{nd}$ de-interleaver for a 3G FDD modem is as follows:

TABLE 1

| Inter-Column Permutation Pattern for De-Interleaver | |
|---|---|
| Number of columns | Inter-Column Permutation Pattern |
| 30 | {0,20,10,5,15,25,3,13,23,8,18,28,1,11,21, 6,16,26,4,14,24,19,9,29,12,2,7,22,27,17} |

The output of the $2^{nd}$ de-interleaver is a bit sequence read out row by row from a mapping to the inter-column permuted N×30 matrix. Where the entire N×30 matrix is output, the output is pruned by deleting bits that were not present in the input bit sequence of data elements.

FIGS. 5a and 5b illustrate a bit mapping of the example received data elements T'0–T'309 of left and right portions of an 11 row by 30 element column interleaver matrix. In FIG. 5a, for example, column 0 reflects the bit mapping of the bits of elements T'0–T'10 which are contained in words W'0, W'1 and W'2. The bits of element T'5 are extracted from two words, W'0 and W'1; the bits of element T'10 are extracted from two words, W'1 and W'2. In FIG. 5b, the bottom row has no elements since only the first ten columns are completely filled by the data elements.

FIGS. 6 and 7a–7c reflect how the elements T' are reordered through the selected storing of the elements in a set of words W based on the interleaver matrix mapping.

Figures 1, 2B:
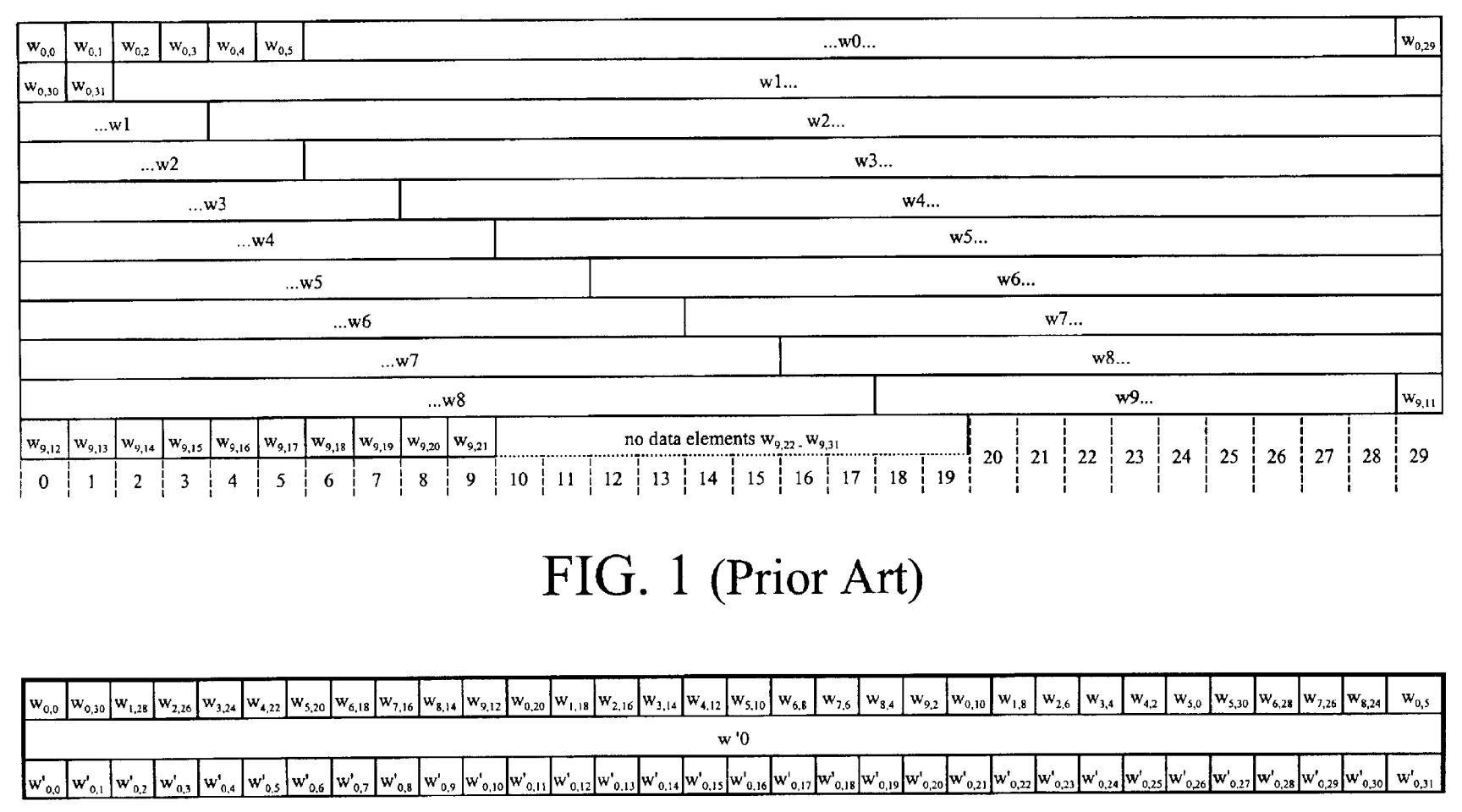
Figure 4A:
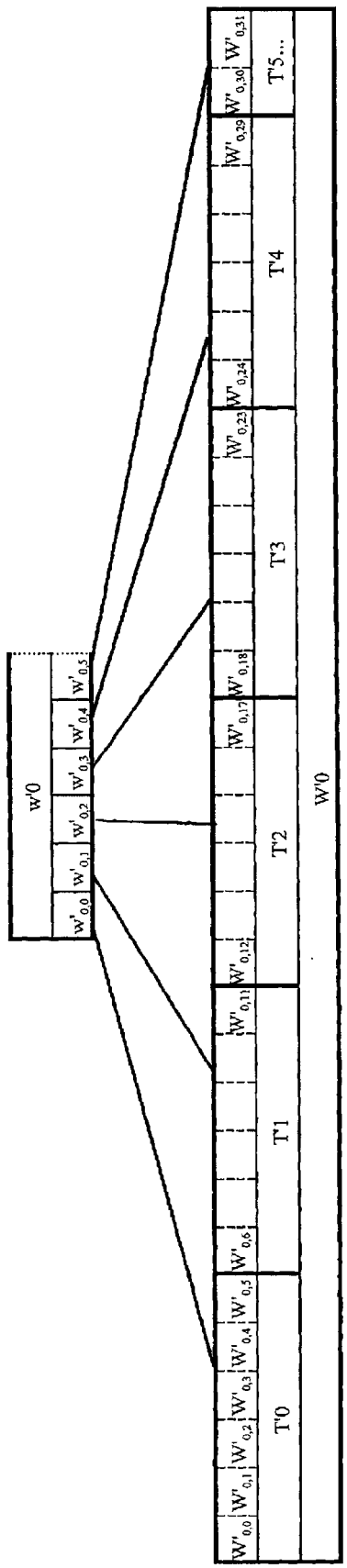
FIGS. 4a–4f illustrate a bit mapping of one of the interleaved bit block words w' of FIG. 2a onto a set of six expanded element interleaved words W'.
Figure 4B:
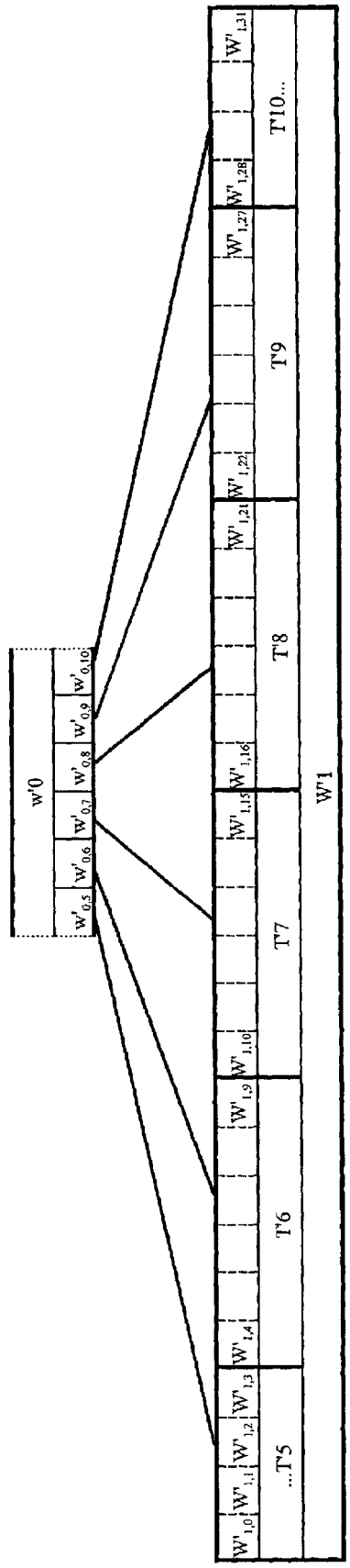
Figure 4C:
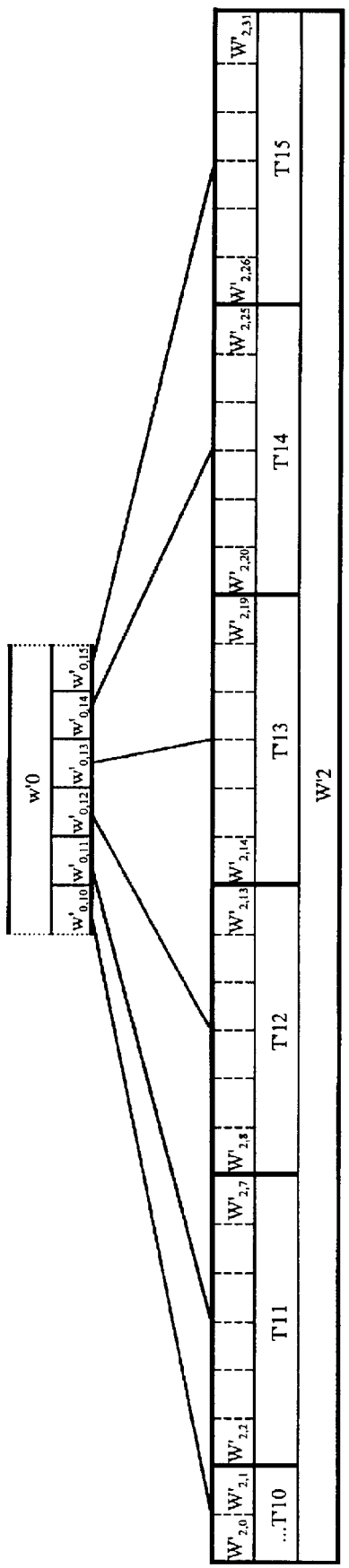
Figure 4D:
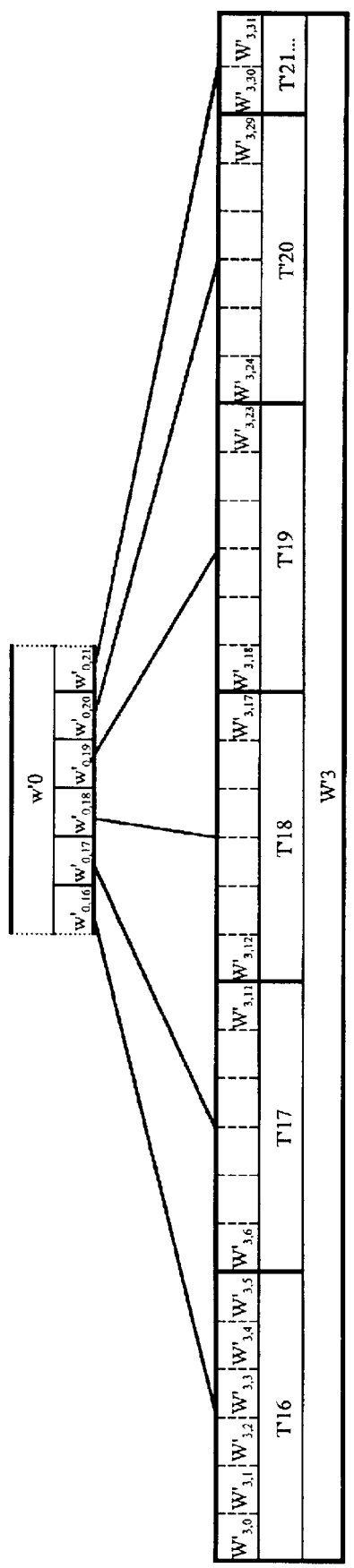
Figure 4E:
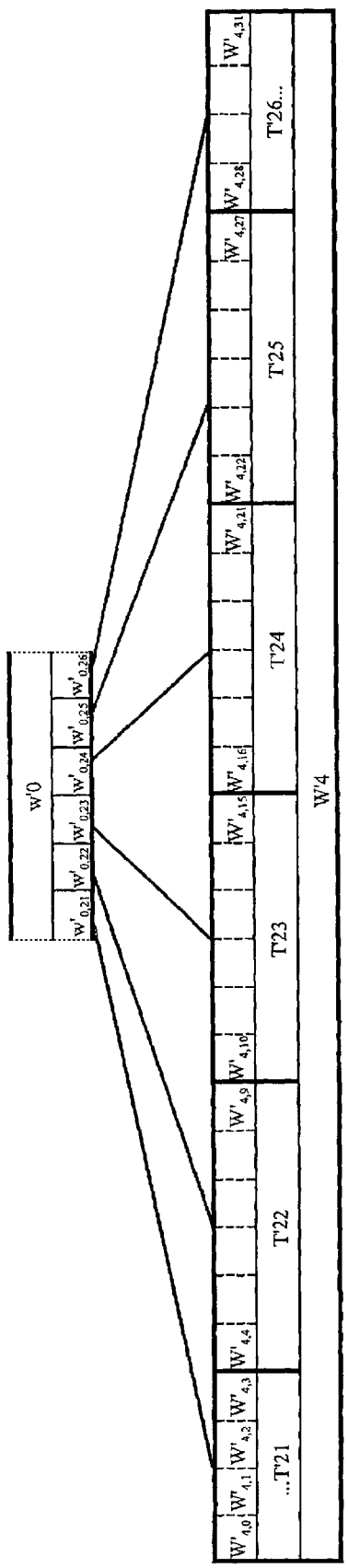
Figure 4F:
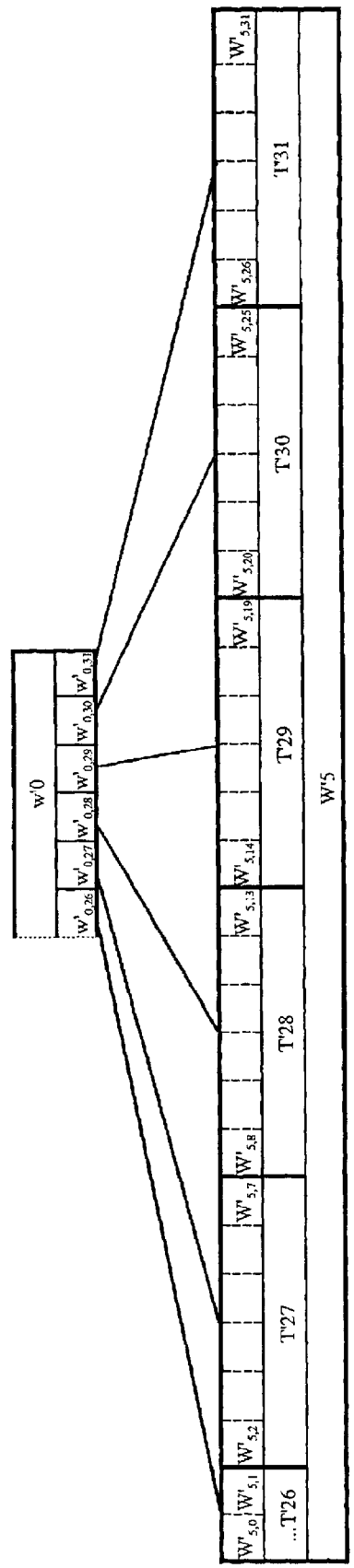
Figure 7A:
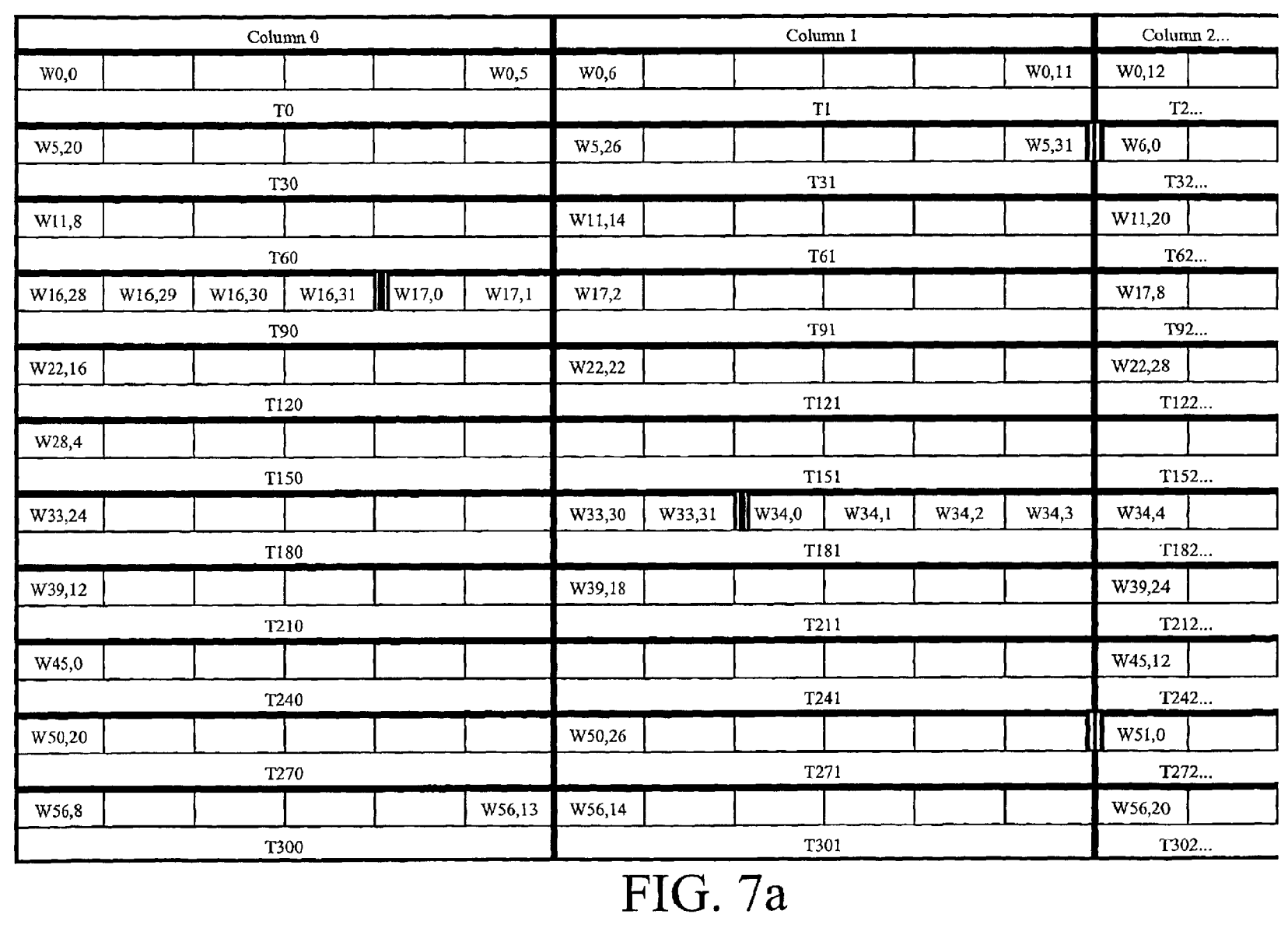
Figure 7C:
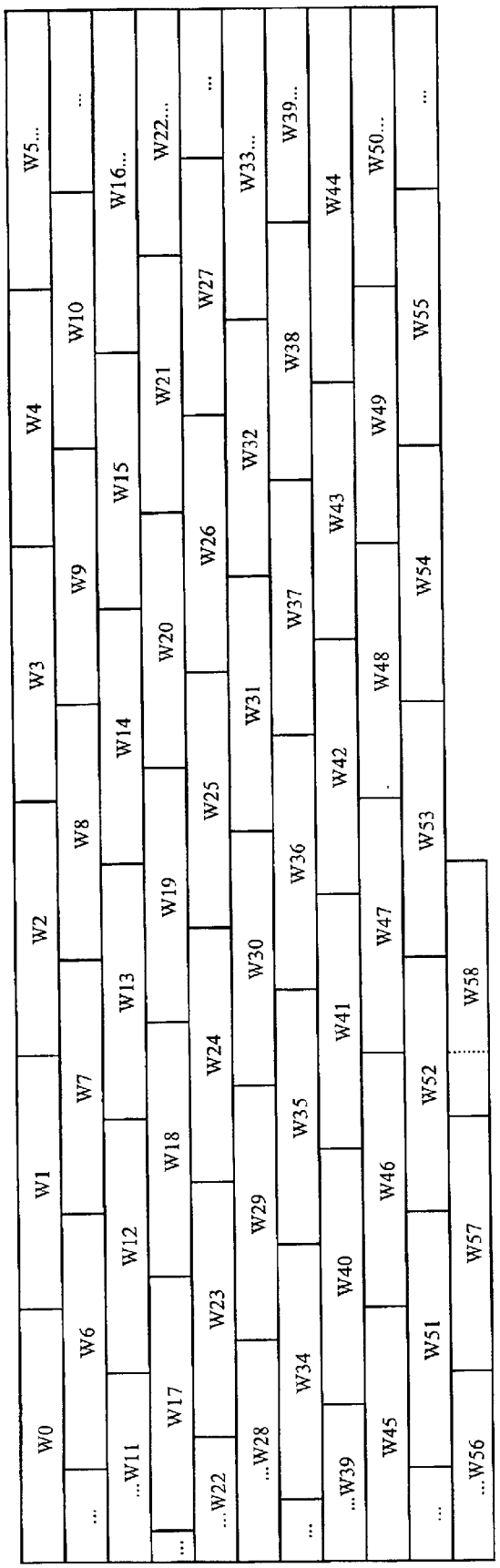
Figure 8:
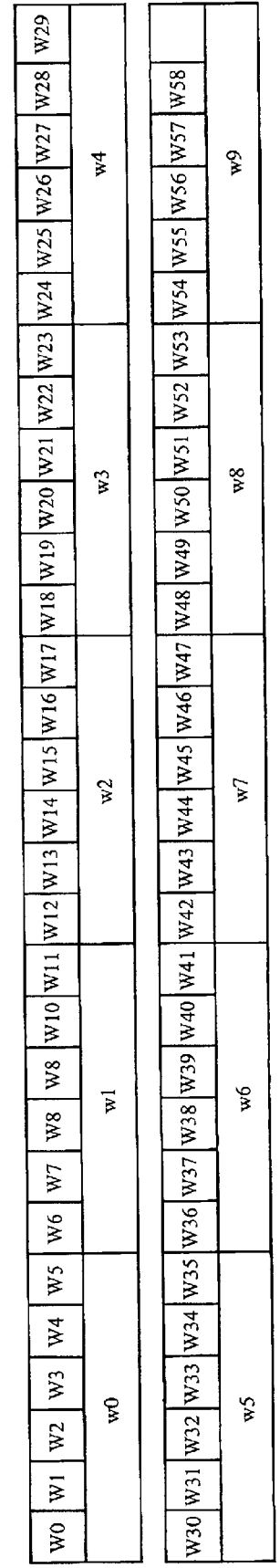
FIG. 8 illustrates the correspondence of the deinterleaved expanded element words W of FIG. 7c with the original data bit block words w of FIG. 1.

Thus, T'0, T'124, T'258, T'186 and the first two bits of T'31 are stored in the 32 bits of word W0 which, accordingly, correspond to reordered elements T0 through T4 an the first two bits of element T5. As a result of the selective storage of the elements T'0 through T'309 based on the interleaver matrix mapping, a series of 32 bit words W, W0 through W58 is formed containing reordered elements T0 through T309 as shown in FIGS. 7a–7c. FIG. 8 reflects how the original word w0–w9 correspond to words W0–W58 illustrating the correspondence of the reordered elements T0–T309 with the 310 original data block bits w0,0–w9,21, shown in FIG. 1.

Figure 10A:
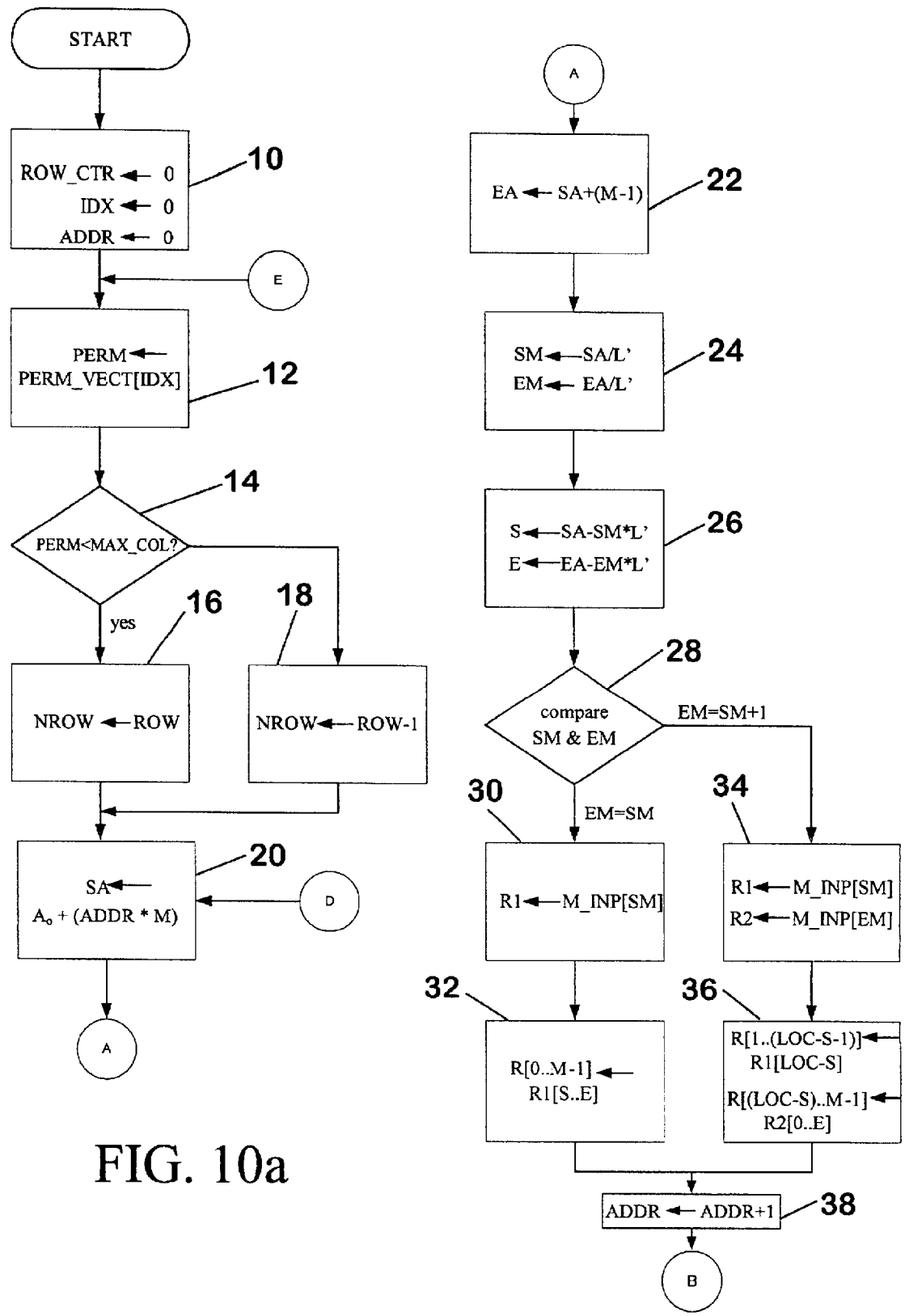
FIGS. 10a and 10b are a flow chart of a general method of deinterleaving in accordance with the present invention.
Figure 10B:
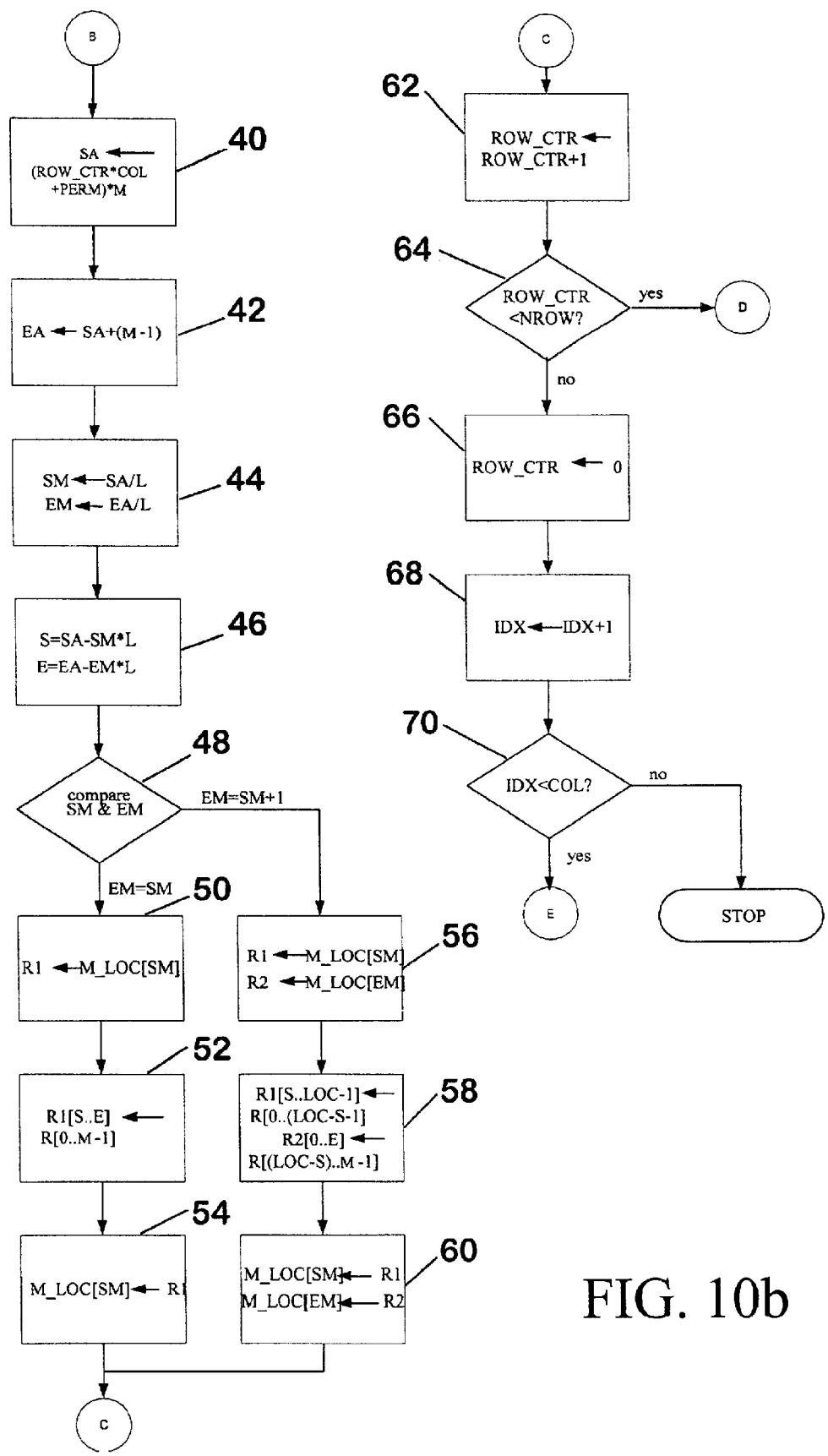

In order to properly place the elements T'0–T'309 in the matrix so that the elements T0–T309 can be read out row by row in sequential words W0–W58, each element T' is selectively processed as reflected in the flow charts of FIGS. 10a and 10b.

In the 3G FDD modem receiver, expanded, interleaved data is separated into different physical channels and stored in a random-access-memory (RAM) named M_INP for processing by the deinterleaver. The bit stream is segmented into words of 32-bits, and the words are placed into contiguous locations in M_INP. In the example of FIGS. 1–4, the bit stream for elements T0–T309 which are contained in the words W'0–W'58 would be stored at sequential addresses in M_INP. The flowchart in FIGS. 10a–10b explains how the de-interleaver reads data from M_INP, de-interleaves it and writes it to a local memory M_LOC. The entire process consists of reading the data out, element by element from M_INP, carrying out an address transformation, and writing the element to that location in M_LOC. This location corresponds to the original location of the element in memory before the interleaving was performed at the transmitter. FIGS. 5–8 illustrate the correspondence of the interleaver mapping of elements T'0–T'309 to resequenced elements T0–T309 in words W0–W59 and, in FIG. 8, the correspondence to the original bit sequence contained in word w0–w9 on the transmitter side.

Table 2 provides a list of parameters as used in the flow chart of FIGS. 10a and 10b.

At the start, the variables used in the process are initialized at block 10. The address incrementer ADDR, and row counter ROW_CTR and column index pointer IDX are set to 0. The pre-defined permutation order is stored in a vector named PERM_VECT. The order of the permuted columns within PERM_VECT is preferably as shown in Table 1 for a FDD modem receiver $2^{nd}$ de-interleaver. In step 12, a valve PERM is output from PERM_VECT based on the IDX value which indicates the column position for the current element being processed.

The next several actions 14, 16, 18 determine the number of rows within column number PERM, and sets the variable NROW to this value. A constant parameter MAX_COL is set such that columns 0, 1, 2, ..., MAX_COL-1 have "ROW" number of rows in them, and columns MAX_COL, ..., C-1 have "ROW-1" rows in them. Based on this fact and the current value of PERM, the variable NROW is set accordingly.

TABLE 2

List of Flow Chart Parameters

| PARAMETER | DESCRIPTION |
|---|---|
| ADDR | Word address incrementer in M_INP for words W' starting at address $A_0$ |
| T | Total number of elements in data block |
| ROW_CTR (or n) | Counter for counting rows in column PERM. |
| PERM_VECT | Column permutation vector. |
| COL (or C) | Number of columns in permutation matrix. |
| ROW (or N) | Number of rows in permutation matrix. |
| PERM (or i) | PERM_VECT element pointed to by IDX. |
| IDX | PERM_VECT element pointer. |
| MAX_COL | Constant value equal to T- (C* (N-1)). |
| NROW | Number of rows in column number PERM. |
| SA | Start bit address of element. |
| EA | End bit address of element |
| SM | Start word address of element. |
| EM | End word address of element. |
| S | Start bit location of element within SM. |
| E | End bit location of element within EM. |
| M | Number of bits in each element T'# or T#. |
| R, R1, R2 | Storage registers. |
| L' | Number of bits in each word of set W'. |
| L | Number of bits in each word of set W. |

In steps 20, 22, using the initial address $A_0$, the current ADDR value, and the element size M, start and end bit-addresses, SA and EA respectively, of the current data element within M_INP are determined. Dividing SA and EA by the word bit size L' and discarding any remainder (or equivalently shifting right by 5) per step 24 generates the corresponding word address in the word set W'. These word addresses are SM and EM, respectively. Then in step 26, the start and end bit-locations of the data element within the memory word(s) identified by SM and EM is calculated as S and E, respectively. S and E may be contained within a single memory word of the set of words W', or be spread across two consecutive memory words. The next set of actions 28, 30, 32, 34, 36 demonstrates how these two scenarios are handled.

The next action 28 in the flowchart is to compare the SM and EM word locations. If the element is within a single word of the set of words W', i.e. EM=SM, then in step 30, the word in location SM is fetched from M_INP. The element is then, in step 32, extracted from its bit locations, as indicated by S and E, and the value is assigned to register R. If, on the other hand, the element is contained within two words of the set of words W', i.e. EM=SM+1, two words have to be accessed from M_INP. Accordingly, the word from SM is fetched and assigned to register R1 and the word from EM is fetched and assigned to register R2 is shown in step 34. Then in step 36 the bits of the element are extracted from R1 and R2 and assigned to register R. Thus, in either case, all of the bits of the interleaved element contained in the set of words W' stored in M_INP are extracted. Finally, the address counter ADDR is incremented for initializing the extraction of the next element.

The next set of actions 40–60, shown in FIG. 10b, is to determine the word(s) and bit location within M_LOC where the extracted element will be stored, access the word(s), place the element within appropriate bit locations within the word(s), and write the word(s) back into M_LOC. These steps can be performed as a single read-modify-write operation.

The start and end mapping bit addresses, SA and EA, of where the extracted element stored in R, in step 32 or 36, will be stored into M_LOC is determined in steps 40–42.

The start address is calculated in step 40 based on the row and element column mapping of the element extracted in steps 30, 32 or 34, 36. The matrix position is calculated by multiplying the row number, given by ROW_CTR, by the number of matrix columns, COL, plus the current column number PERM derived from the PERM_VECT vector, i.e. (ROW_CTR*COL)+PERM. Since each element has M bits, the result is multiplied by M to get SA.

Dividing SA and EA by L, the bit size of the words in set W, and discarding the remainder, generates the corresponding word addresses in step 46. These word addresses are SM and EM, respectively. Finally, the start and end bit-locations of where the extracted element in register R is to be placed are computed as S and E, respectively. Where L is not evenly divisible by M, S and E may be contained within a single memory word, or be spread across two consecutive memory words of the set of words W. The next set of actions 48, 60 describe how these two scenarios are handled.

In step 48, the addresses SM and EM are compared. If the extracted element is to be stored is within a single word, i.e. SM=EM, then in step 50 the word in location SM is fetched from M_LOC and placed in register R1. The extracted element value in R is then, in step 52, written to the bit locations indicated by S and E within R1. Finally, R1 is written back into memory location SM of M_LOC in step 54.

If on the other hand, the extracted element is to be stored within two consecutive words having addresses SM and SM+1, those words are fetched in step 56 from M_LOC and placed in registers R1 and R2, respectively. Then, in step 58, the bits of the extracted element within R are placed into appropriate locations in registers R1 and R2, respectively, based upon S and E. Finally, the register contents of R1 and R2 are written back, in step 60, into memory locations SM and SM+1, respectively.

The next action in step 62 is to increment the row counter ROW_CTR by 1 to indicate that the next extracted element T'# will be stored in the next row of the same column. A check is made in step 64 to determine if the row counter is less than or equal to the number of rows of the current column, NROW. If that is the case, the process continues at step 20 with the next element within column member PERM.

If ROW_CTR is not less than NROW, in step 64, the next extracted element will be stored at an address corresponding to the first row (row 0) of the next column indicated by the vector PERM_VECT. Accordingly, if that is the case, ROW_CTR is reset to 0 and the PERM_VECT index, IDX, is incremented by 1 in steps 66, 68. If, in step 70, IDX is less than COL, the de-interleaving process is repeated from step 12 with a new value of PERM being assigned, otherwise the process is stopped since all T elements of the data block will have been processed.

Figure 11A:
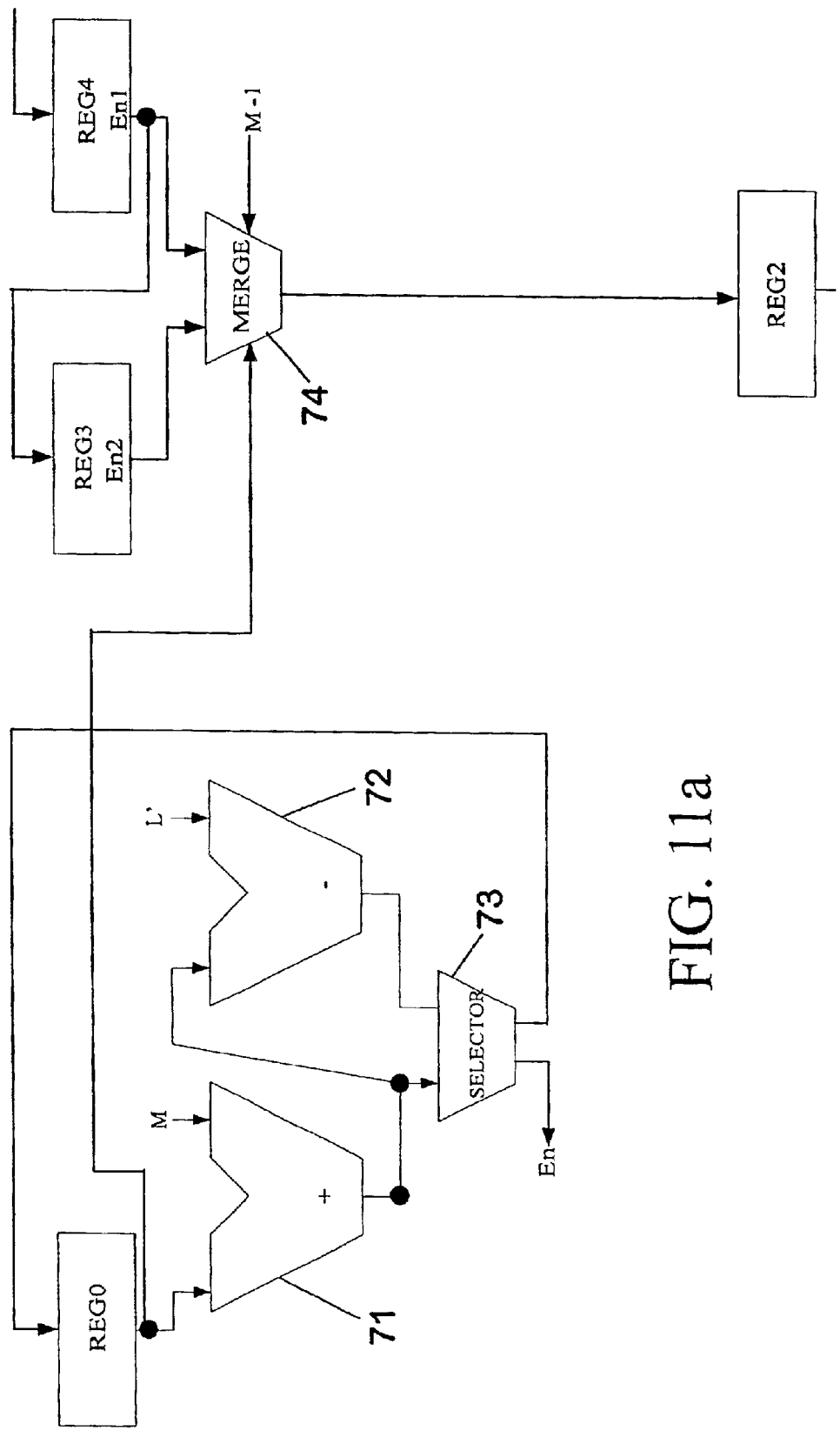
FIGS. 11a–11c are a schematic diagram of a three stage pipeline interleaver in accordance with the present invention.
Figure 11B:
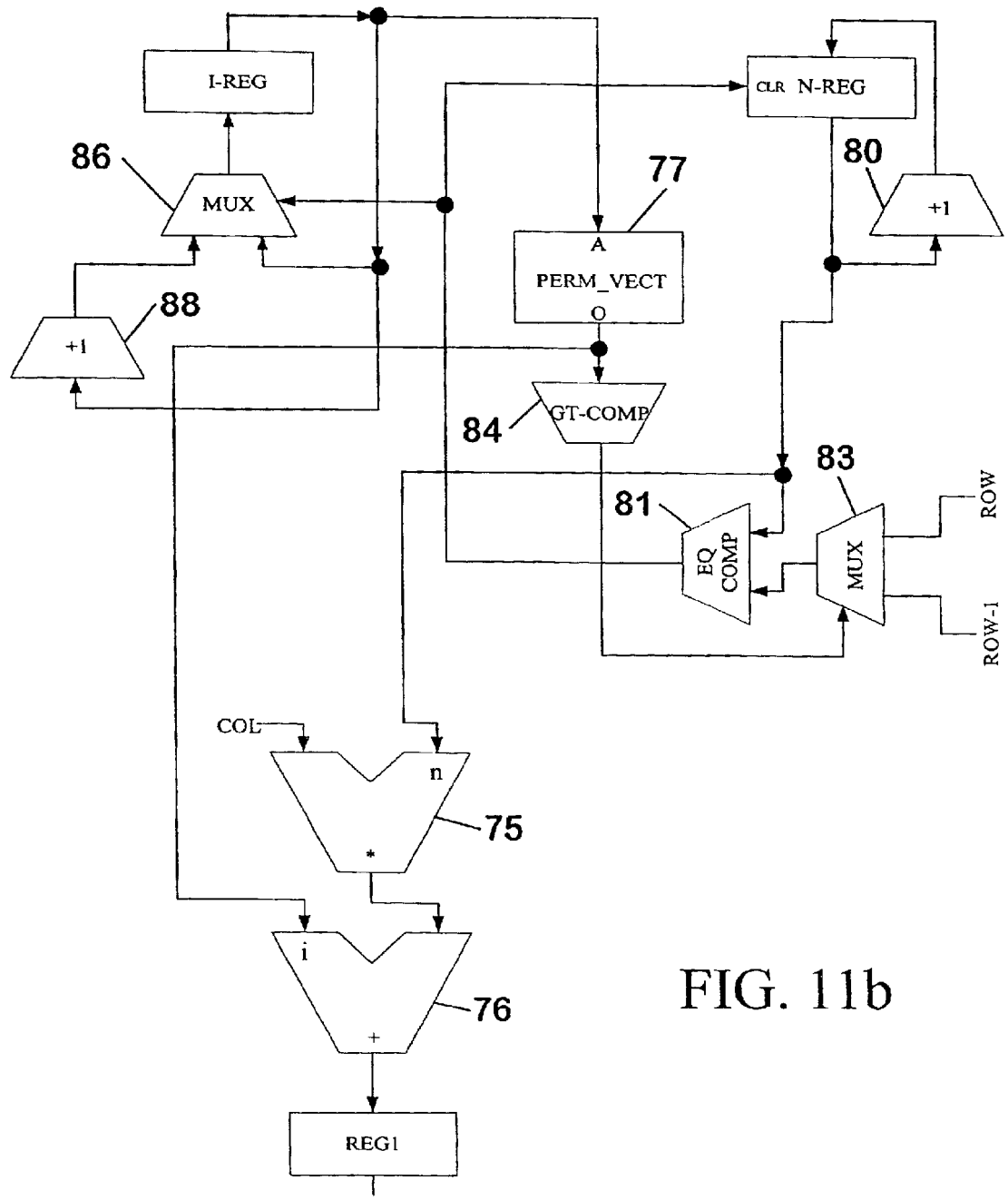
Figure 11C:
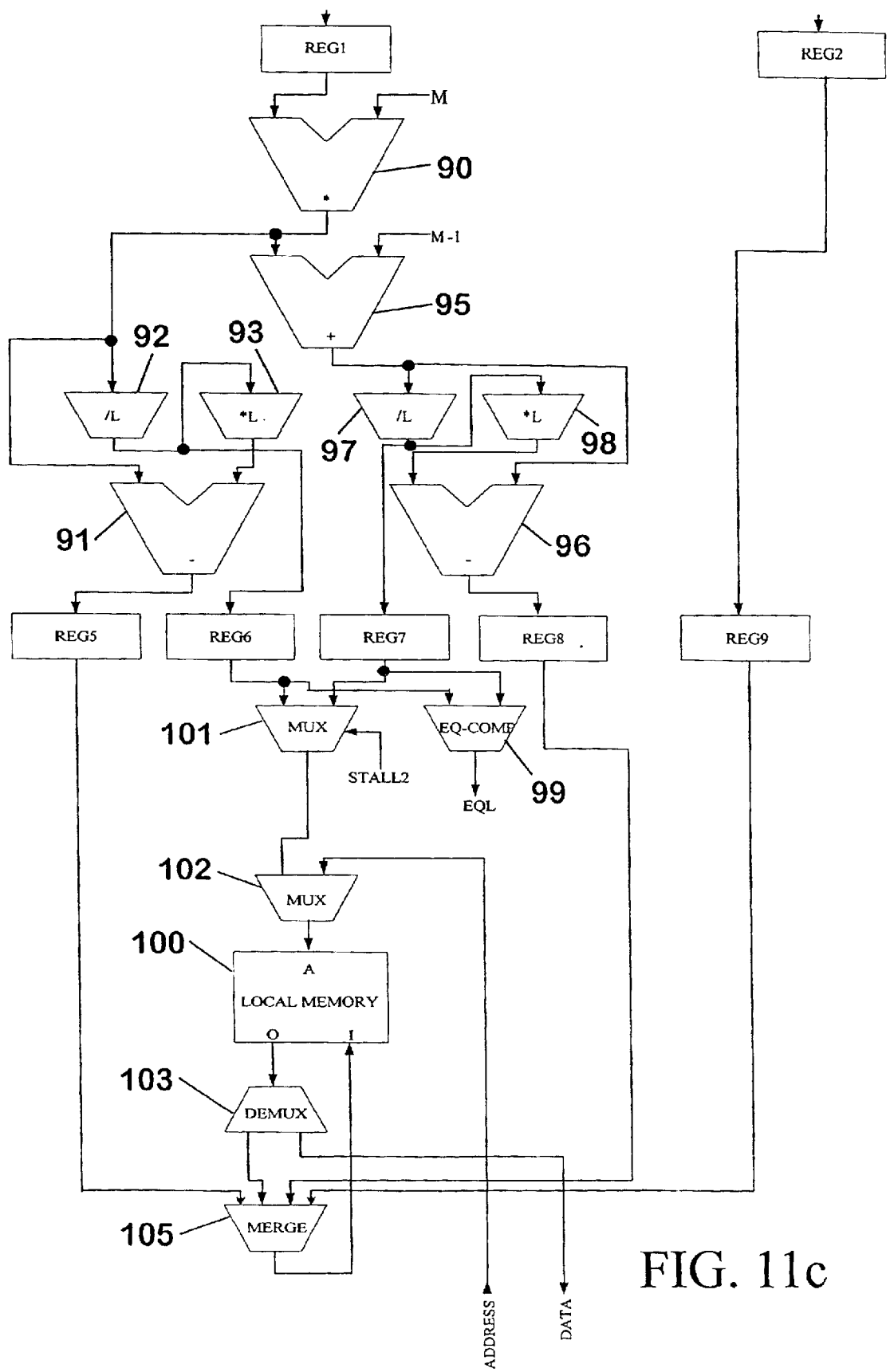

While the general processing method is described in accordance with the flow charts of FIGS. 10a and 10b, a preferred implementation of the process in hardware is illustrated in FIGS. 11a–11c. The preferred design consists of a 3-stage pipeline, with an associated memory, LOCAL MEMORY, for storing the deinterleaved bits of data. Parallel processing components of the first stage are illustrated in FIGS. 11a and 11b; the second and third stage processing is illustrated in FIG. 11c.

The operation of stage-1 commences with the extraction of a data element from a 2L' bit vector defined by the contents of two registers REG3 and REG4. The registers REG3 and REG4 store two consecutive L' bit words from physical channel (PyCH) memory. For the preferred 32-bit word size, these two registers form a 64-bit vector of bits.

A register REG0, an adder 71, a substracter 72, and a selector 73, are configured to operate in conjunction with a merge device 74 to extract elements having a size of M bits from registers REG3 and REG4 on a sequential basis and store the element in a register REG2. To initialize the interleaver, first and second words of the sequential words W' are initially stored in registers REG3 and REG4, respectively, and register REG0 is initialized to 0. The merge device 74 receives the value 0 from register REG0, extracts the M bits starting at address 0 through address M-1. Thus, the first M bit from the initial word in REG3, which corresponds to the first element T'0 are extracted. The merge device 74 then stores the extracted M bits in the pipeline register REG2.

The value of register REG0 is incremented by either M via the adder 71 or M-L' via the adder 71 and the substracter 72 based upon the action of the selector 73. If incrementing the value of register REG0 by M does not exceed L', the selector 73 increments register REG0 by M. Otherwise, the selector 73 increments the register REG0 value by M-L'. This effectively operates as a modulo L' function so that the value of REG0 is always less than L' thereby assuring that the start address of the element extracted by the merge device 74 is always within the bit addresses 0-L'-1 of register REG3.

Where the selector 73 selects to increment register REG0 by M-L', a signal EN is sent to trigger the transfer of the contents of REG4 to REG3 and the fetching of the next sequential word of the set of words W' from the external memory for storage in REG4. During the fetch process, the entire pipeline is stalled. The subtracting of L' in conjunction with the incrementing of the value of register REG0 corresponds with the transfer of the word W' in register REG4 to register REG3 so that the sequential extraction of elements is continued with at least the first bit of the element being extracted from the contents of register REG3.

With reference to FIG. 11b, an interleaver positioning value is calculated in parallel with the extraction process for the element being extracted. The matrix mapping information is calculated by retrieving a current row value n from a register N-REG, and multiplying it in a multiplier 75 by the number of element columns COL in the interleaver matrix. An adder 76, then adds a current column value i which is output from a register file 77 containing the interleaver column sequence as a vector PERM_VECT. The output of the register file 77 is controlled by the content of an index register I-REG which increments the value of the output of the register file 78 in accordance with the vector PERM_VECT.

The matrix mapping circuitry also include elements to selectively increment the row index register N-REG and the column index register I-REG. The circuitry effectively maintains the same column until each sequential row value has been used and then increments the column to the next column in the interleaver vector starting at the initial row of that column. This is accomplished through the use of a unit incrementer 80 associated with the row register N-REG to increment the row value by one for each cycle of first stage processing. The output of register N-REG is also compared in comparator 81 against a maximum row value determined by a multiplexer 83. The maximum row value for the particular column is either the maximum row value ROW of the entire matrix or ROW-1. The multiplexer 83 generates an output in response to a comparator 84 which compares the column value currently being output by the register file 78 with the largest column value having the maximum row size ROW.

If the comparator 81 determines that the maximum row number has been reached by the output value of register N-REG, the comparator 81 issues a signal to reset N-REG to 0 and to operate a multiplexer (MUX) 86 associated with the index register I-REG. A unit incrementer 88 is also associated with the index register I-REG and the MUX 86 permits incrementation of the I-REG value by one via the incrementer 88 when a signal is received from comparator 81. Otherwise, the multiplexer 86 simply restores the same value to register I-REG during a first stage cycle.

Referring to FIG. 11c, the second stage of the pipeline interleaver comprises a processing cycle where the element extracted and stored in the first pipeline register REG2 is transferred and stored into a second data pipeline register REG9. In parallel in the second stage of processing, the corresponding matrix mapping data stored in register REG1 is used to calculate corresponding start bit address data which is stored in a register REG5, end bit address data which is stored in a register REG8, start word address data which is stored in a register REG6, and end word address data which is stored in a register REG7. During a second stage cycle, the matrix mapping data from REG1 is initially multiplied by the element bit size M in a multiplier 90. The start bit address data is then calculated by subtracting from that resultant value in a substracter 91 a value to produce a modulo L equivalent, where L is the bit size of the data words of a local memory 100 where the extracted elements are to be selectively stored. The value subtracted in substracter 91 is calculated by dividing the output of multiplier 90 by L without remainder in divider 92 and multiplying that value by L in multiplier 93. The output of the divider 92 also provides the start word address of the corresponding word within which at least a first portion of an element in register REG9 is to be stored in the local memory 100.

The end bit address data is calculated by adding M−1 to the result of the multiplier 90, in an adder 95 and then subtracting from that value in a subtracter 96 a value calculated to produce a modulo L value which is then stored in register REG8. The value subtracted is derived by dividing the output of the adder 95, in a divider 97, by L without remainder and then multiplying the result by L in a multiplier 98. The output of divider 97 also provides the end word address data which is stored in register REG7.

The third stage of the pipeline interleaver performs a read-modify-write to selectively store the element value in register REG9 in the local memory based upon the data in registers REG5, REG6, REG7 and REG8. Initially, the contents of registers REG6 and REG7 are compared in a comparator 99. If the values are equal, the element in register REG9 will be stored within a single word of the local memory 100. In that case, the value from register REG6 passes through multiplexer 101 to multiplexer 102 where it may be combined with a base address which can be used to allocate overall memory resources within the system.

The output of multiplexer 102 indicates the address of the word W into which the element in register REG9 is to be written. That word is output to a de-multiplexer 103 whereupon a merged device creates a new word comprised of the bit values of the element in register REG9 in the sequential addresses within the word starting with the value in register REG5 and ending with the value in register REG8, with the remaining bits of the word being copied from the values of the word in de-multiplexer 103. The newly formed word in the merge device 105 is then stored back to the address from which the original word was output to the de-multiplexer 103.

Where the contents of registers REG6 and REG7 are different, the first and second stages of the pipeline are stalled for one cycle so that the third stage can perform a read-modify-write cycle with respect to the word identified by the data in register REG6 and then resume the pipeline cycles of all stages to perform a read-modify-write with respect to the local memory word corresponding to the end word data stored in register REG7. In that case, during the read-modify-write cycle with respect to the word corresponding to the start word address data in register REG6, the third stage stores an initial portion of the element stored in register REG9 in the last bits of the local memory word starting with the bit position indicated by the value stored in register REG5. During a second third stage cycle, where the first and second stage cycles are resumed, the remaining portion of the element in register REG9 is stored in the word corresponding to the end word address data in register REG7 starting with the initial bit of that word through the bit address indicated by the value in register REG8.

After all T elements of a block of data bits have been processed, the sequential words of the local memory are read out via the de-multiplexer 103 for further processing in the system. The output of the local memory after processing for the 310 element data block reflected in the example of FIGS. 5–8 correspond to the word sequence reflected in FIG. 7c. During further processing within a 3G system, the expanded six bit elements are contracted to a single bit thereby, for the example, reproducing the original 310 bit data block in the same sequence as originally occurring in the transmitter unit.

Testing of the 3-stage pipeline of the second interleaver was carried out using two different techniques. First of these testing methods was a manual technique called regression. Regression testing was carried out by fetching 30, 32-bit words from the PyCH memory, extracting 6-bit elements from them, and passing them down the pipeline. The testing cycle was based on manual cycle-bases simulation, where the expected contents of the registers and the internal memory were determined by hand. These values were compared with the actual values obtained from simulation. The simulation was carried out for a large number of test cases and for all cases of the pipeline stall condition. The interleaver pipeline was found to function correctly under all the test scenarios of the manual setting.

Next, the interleaver was independently implemented in C-language. A set of test vectors were applied to the C-block and outputs were monitored and written to a results file. The same set of input test vectors were applied to the VHDL model. Two sets of input vectors were used in the tests:

A 201-element input vector and a 540-element input vector. Two different sets of inputs were used to create two different interleaver matrices. The 201-element matrix had two different row sizes; one row is one less than the other one. The 540-element matrix had a single row size. Thus, the tests included the two different types of interleaver matrix structures that are possible. The test results showed that the output vectors from the VHDL model and the C-language model matched the two input cases.

The hardware was synthesized using Synopsys Logic Synthesizer, Using Texas Instruments 0.18 um standard cell library. The gate counts are given below.

TABLE 3

Total gate count estimate for the interleaver

| | |
|---|---|
| Number of Standard Cells (TI/GS30/Std-Cell) | 1034 |
| Sequential gates | 1844 |
| Combination gates | 3348 |
| Total gates | 5192 |

The pipelined architecture ensures a high-rate of throughput, and a small compact area due low number of gates. While a three stage pipeline is preferred, a two stage design is easily implemented by eliminating registers REG1 and REG2 from the preferred system illustrated in FIGS. 11a–11c.

Other variations and modifications will be recognized by those of ordinary skill in the art as within the scope of the present invention.

What is claimed is:

1. A method of processing data in a communication systems by selectively resequencing a block of T sequential expanded data elements having a bit size M contained in a sequential set of data words W' having a bit size L' to produce a set of sequential data words W having a bit size L containing the T expanded data elements in a selected sequence based upon an interleaver mapping to a matrix having C element columns and N rows where L and L' are integers larger than M, C is not equal to L and the last r columns of the matrix have N−1 rows where r<C and r=(C*N)−T, comprising:

sequentially extracting the T data elements from the set of sequential data words W';

determining a matrix mapping position for a first extracted element at a first row of an initial column of a pre-determined interleaver column sequence;

for each subsequent extracted data element, determining a matrix mapping position of a row n and a column i at a next row of the same column as the immediately preceding data element or, if that column has no next row, the first row of the next column in the pre-determined interleaver column sequence;

defining a row by row sequential mapping of M bit sequential addresses of a local memory of data words W corresponding to the C by N matrix;

for each data element, determining a sequential bit address within one word or spanning two sequential words of the set of words W corresponding to the element's determined matrix mapping position; and storing each data element at its determined address.

2. The method of claim 1 wherein the steps are performed in a receiver modem as a second deinterleaving process further comprising:

after storing a last of the T sequential data elements, sequentially reading out the data words W from the local memory whereby the T elements are sequentially ordered in a deinterleaved sequence corresponding to a block of T data bits from which the block of T sequential expanded interleaved data elements was created in a transmitter modem.

3. The method of claim 1 wherein the element extraction includes determining a start bit address and an end bit address which corresponds to a data element to be extracted and storing the data between and inclusive of the determined bit addresses in a register.

4. The method of claim 3 wherein the set of words W' are located at sequential addresses of a memory starting at address $A_0$ wherein a start bit address for the first extracted element is $A_0$ and a start bit address for each subsequent extracted element is M more than an immediately preceding extracted element.

5. The method of claim 1 wherein:

the sequential set of data words W' is sequentially read into first and second registers from which each element is extracted and stored in a first pipeline register;

first and second sequential words of the set of words W' are initially stored in the first and second registers, respectively;

the first data element is extracted from the first M bits the first word in the first register;

each subsequent element is extracted starting with bits of a word in the first register; and after all bits of a word of the set of words W' in the first register have been extracted, the word of the set of words W' in the second register is transferred to the first registered and a next sequential word of the set of words W' is stored in the second register.

6. The method of claim 5 wherein:

the first register has addresses $A_0$ through $A_0+(L'-1)$ and the second register has addresses $A_0+L'$ through $A_0+(2L'-1)$;

a start address $A_0+0$ is defined for the first data element; and a start address for each subsequent element is defined as address $A_0+SA$ of the first register based on a start address $A_0+SA'$ of an immediately preceding element such that when SA'+M<L', SA=SA'+M, and when SA'+M≧L', SA=(SA'+M)−L and, before extraction, the word in the second register is stored to the first register a the next sequential word of the set of words W' is stored to the second register.

7. The method of claim 5 wherein the matrix mapping position row and column for each element is determined in parallel with the storage of an element in the first pipeline register thereby defining a cycle of a first stage of processing.

8. The method of claim 7 wherein an element in the first pipeline register is stored to a second pipeline register and local memory address information is determined for that element in parallel thereby defining a cycle of a second stage of processing.

9. The method of claim 8 wherein the local memory includes bit addresses $A'_0$ through $A'_0+(T*M)-1$ where each sequential word of the set of words W is assigned L sequential bit addresses, and a local memory start address LSA for each data element is determined by LSA=$A'_0$+((n*C)+i)*M) where LSA=$A'_0$ for the first data element.

10. The method of claim 9 wherein:

the first register has addresses $A_0$ through $A_0+(L'-1)$ and the second register has addresses $A_0+L'$ through $A_0+(2L'-1)$;

a start address $A_0+0$ is defined for the first data element; and a start address for each subsequent element is defined as address $A_0+SA$ of the first register based on a start address $A_0+SA'$ of an immediately preceding element such that when SA'+M<L, SA=SA'+M, and when SA'+M≧L, SA=(SA'+M)−L and, before extraction, the word in the second register is stored to the first register and a next sequential word of the set of words W' is stored to the second register.

11. The method of claim 8 where at least a portion of an element in the second pipeline register is stored to a word of the set of words W in the local memory thereby defining a cycle of a third stage of processing.

12. The method of claim 11 where a local memory start address LSA and a local memory end address LEA is determined for each data element during a second stage processing cycle and when LSA and LEA are in two consecutive words of the set of words W of the local memory, a first portion of the element in the second pipeline register is stored in one of the two words during a third stage processing cycle while the first and second processing stages are stalled for one cycle.

13. The method of claim 12 wherein, except for the first and last elements, each time a second stage processing cycle occurs, a first stage processing cycle and a third stage processing cycle also occurs.

14. The method of claim 13 wherein first, second and third stage processing is stalled while the word in the second register is transferred to the first register and a next sequential word of the set of words W' is stored in the second register.

15. An interleaver for selective resequencing a block of T sequential data elements having a bit size M contained in a sequential set of data words W' having a bit size L' to produce a set of sequential data words W having a bit size L containing the T data elements in a selected sequence based upon an interleaver mapping to a matrix having C element columns and N rows where L and L' are integers larger than M, C is not equal to L and the last r columns of the matrix have N−1 rows, where r<C and r=(C*N)−T, comprising:
a memory device from which sequential words W' are accessed;
a first pipeline register for receiving data elements extracted from the memory device;
a matrix position register device for receiving matrix position data relating to an element being stored in the first pipeline register;
a second pipeline register for sequentially receiving data elements from the first pipeline register;
a local memory;
a local address register device for receiving local memory address data relating to an element being stored in the second pipeline register;
first stage processing circuitry including
circuitry for sequentially extracting data elements from the memory device and storing each sequentially extracted element in the first pipeline register, and
matrix mapping circuitry for generating and storing corresponding matrix position data in the matrix position register device;
second stage processing circuitry for generating and storing local memory address data in the local address register device from matrix position data stored in the matrix position register device corresponding to an element being transferred from the first pipeline register and stored in the second pipeline register; and
third stage processing circuitry for retrieving data elements stored in the second pipeline register and selectively storing each data element in sequential words of the set of words W of the local memory based on the corresponding address data stored in the local address register device.

16. An interleaver according to claim 15 wherein L' is not equally divisible by M, the memory device comprises first and second L' bit registers to which words from the set of words W' are sequentially transferred, and the first stage processing circuitry extracts elements from M sequential bit addresses which start at selectively determined bit addresses of the first L' bit register.

17. An interleaver according to claim 15 wherein the matrix position register device is a single register and the matrix mapping circuitry includes a column index register, a row index register, and an interleaver vector memory which are selectively coupled such that the row index register is incremented or reset in conjunction with generating matrix position data for each element, the column index register is incremented in conjunction with resetting the row register, and the column index register is used to increment an output of the interleaver vector memory in accordance with an interleaver vector stored therein.

18. An interleaver according to claim 17 wherein for each data element, the row register outputs a value n and the interleaver vector memory outputs a value i and the value (n*C)+i is stored in the matrix position register in connection with the storage of an element in the first pipeline register.

19. An interleaver according to claim 18 wherein L'=32, C=30, M=6, the memory device comprises first and second L bit registers to which words of the set of words W' are sequentially transferred, and the first stage processing circuitry extracts elements from M sequential bit addresses which start at selectively determined bit addresses of the first L' bit register.

20. An interleaver according to claim 15 wherein L is not equally divisible by M, the local address register device includes a start bit address register, an end bit address register, a start word address register, and an end word address register, and the second stage processing circuitry calculates start bit address data, end bit address data, start word address data, and end word address data for the respective registers of the local address register device based upon matrix position data (MPD) stored in the matrix position register device, the data element bit size M and the data word bit size L in conjunction with the transfer of an element from the first pipeline register to the second pipeline register.

21. An interleaver according to claim 20 wherein the second stage processing circuitry calculates the start bit address data to be MPD modulo L, the end bit address data to be (MPD+M) modulo L, the start word address data to be the largest integer resulting from MPD/L and the end word address data to be the largest integer resulting from (MPD+M)/L.

22. An interleaver according to claim 21 wherein a first stage cycle is defined when the first stage processing circuitry extracts a new element from the memory device and stores it in the first pipeline register, a second stage cycle is defined when an element is transferred from the first pipeline register to the second pipeline register, and a third stage cycle is defined when the third stage circuitry selectively stores at least a portion of an element from the second stage pipeline register in a word of the set of words W of the local memory, wherein the second stage processing circuitry is associated with the first stage processing circuitry and the third stage processing circuitry such that, except for first and last of the T sequential elements, each time a second stage cycle occurs, a first stage cycle and a third stage cycle also occur.

23. An interleaver according to claim 22 wherein the third stage processing circuitry includes a comparator for comparing the contents of the start word address register and the end word address register which is associated with data storage circuitry and the first and with second stage processing circuitry such that:

when the start word address data equals the end word address data, the element in the second pipeline register is stored in a word of the set of words W corresponding to the start word address data at a bit location within that word corresponding to the start bit address data stored in the start address register through an address corresponding to the end bit address data stored in the end bit address register; and when the start word address data is not equal to the end word address data, the first and second stage processing circuitries are stalled for one cycle while a first portion of the element stored in the second pipeline register is stored in a word of the set of words W corresponding to the start word address data at a bit location starting with the bit address corresponding to the start bit address data stored in the start bit address register through an end bit of that word thereby completing one third stage cycle and in a subsequent third stage cycle, when the first and second stage processing circuitries are not stalled, a second portion of the element stored in the second pipeline register is stored in a next sequential word of the set of words W corresponding to the end word address data starting at a first bit of that word through a bit location corresponding to the end bit address data stored in the end bit address register.

24. An interleaver for selective resequencing a block of T sequential data elements having a bit size M contained in a sequential set of data words W' having a bit size L' where to produce a set of sequential data words W having a bit size L containing the T data elements in a selected sequence based upon an interleaver mapping to a matrix having C element columns and N rows where L and L' are integers larger than M, C is not equal to L and the last r columns of the matrix have N−1 rows, where r D C and r=(C*N)−T, comprising:

a memory device from which sequential words of the set of words W' are accessed;

a pipeline register device for receiving data elements extracted from the memory device;

a local memory;

a local address register device for receiving local memory address data relating to an element being stored in the pipeline register device;

element extracting circuitry for sequentially extracting data elements from the memory device and storing each sequentially extracted element in the pipeline register device;

matrix mapping circuitry for generating matrix position data for each extracted element;

address processing circuitry for generating and storing local memory address data in the local address register device from matrix position data corresponding to an element being stored in the pipeline register device; and storage processing circuitry for sequentially retrieving data elements stored in the pipeline register device and selectively storing each data element in sequential words of the set of words W of the local memory based on corresponding address data stored in the local address register device.

* * * * *

UNITED STATES PATENT AND TRADEMARK OFFICE
CERTIFICATE OF CORRECTION

| | |
|---|---|
| PATENT NO. | : 6,947,491 B2 |
| APPLICATION NO. | : 09/908820 |
| DATED | : September 20, 2005 |
| INVENTOR(S) | : Sharif M. Shahrier |

It is certified that error appears in the above-identified patent and that said Letters Patent is hereby corrected as shown below:

IN THE SPECIFICATION

At column 1, line 43, after the word "bit", delete "then" and insert therefor --than--.

At column 2, line 18, after the word "times.", insert --Receive processing can, for example, result in an apparent six fold bit expansion.--.

At column 3, line 17, after the word "drawings", insert --and--.

At column 3, line 54, after the word "are", delete "a flow chart" and insert therefor --flow charts--.

At column 3, line 56, after the word "are", delete "a schematic diagram" and insert therefor -- schematic diagrams--.

At column 4, line 15, after the word "herein", insert --as--.

At column 4, line 24, after the word "expanded", delete "it" and insert therefor --bit--.

At column 5, line 46, before the word "of", delete "chart" and insert therefor --charts--.

At column 5, line 54, before "FDD", delete "a" and insert therefor --an--.

At column 6, line 34, after "EM", delete "is" and insert therefor --are--.

At column 6, line 66, after the word "element", insert --is--.

At column 6, line 67, after "M_LOC", delete "is" and insert therefor --as--.

At column 7, line 20, after the word "element", delete "is".

At column 8, line 3, after "71, a", delete "substracter" and insert therefor --subtracter--.

At column 8, line 18, after the words "and the", delete "substracter" and insert therefor -- subtracter--.

At column 9, line 28 after the words "resultant value in a", delete "substracter" and insert therefor --subtracter--

At column 9, line 31-32, after the words "value subtracted in", delete "substracter" and insert therefor --subtracter--.

UNITED STATES PATENT AND TRADEMARK OFFICE
CERTIFICATE OF CORRECTION

PATENT NO. : 6,947,491 B2
APPLICATION NO. : 09/908820
DATED : September 20, 2005
INVENTOR(S) : Sharif M. Shahrier It is certified that error appears in the above-identified patent and that said Letters Patent is hereby corrected as shown below:

IN THE CLAIMS

At claim 6, column 12, line 35 after the words "stored to the first register", delete "a the" and insert therefor --and a--.

Signed and Sealed this

Twelfth Day of December, 2006

JON W. DUDAS
*Director of the United States Patent and Trademark Office*